United States Patent [19]

Eichelberger

[11] Patent Number: 5,149,662
[45] Date of Patent: Sep. 22, 1992

[54] METHODS FOR TESTING AND BURN-IN OF INTEGRATED CIRCUIT CHIPS

[75] Inventor: Charles W. Eichelberger, Schenectady, N.Y.

[73] Assignee: Integrated System Assemblies Corporation, Schenectady, N.Y.

[21] Appl. No.: 839,920

[22] Filed: Feb. 21, 1992

Related U.S. Application Data

[62] Division of Ser. No. 676,206, Mar. 27, 1991, Pat. No. 5,091,769.

[51] Int. Cl.[5] ............................................. H01L 21/66
[52] U.S. Cl. ........................................... 437/8; 437/51; 437/209
[58] Field of Search .................. 437/8, 51, 209, 211; 148/DIG. 162; 375/74, 80

[56] References Cited

U.S. PATENT DOCUMENTS

| | | | |
|---|---|---|---|
| 4,937,203 | 6/1990 | Eichelberger et al. | 437/8 |
| 4,953,001 | 9/1990 | Kaiser, Jr. et al. | 357/74 |
| 4,962,415 | 10/1990 | Yamamoto et al. | 357/74 |
| 4,981,817 | 1/1991 | Stowe, Jr. | 437/8 |
| 4,985,753 | 1/1991 | Fujioka et al. | 857/80 |
| 5,047,711 | 9/1991 | Smith et al. | 437/8 |

Primary Examiner—Brian E. Hearn
Assistant Examiner—Kevin M. Picardat
Attorney, Agent, or Firm—Heslin & Rothenberg

[57] ABSTRACT

Packaging methods and configurations are disclosed for placing electronic integrated circuit chips into operable chip systems in a manner to facilitate burn-in and testability thereof. The invention addresses the problem of testing bare integrated circuit chips before they are committed to a multichip module. Further, it addresses the problem of burning-in bare chips under biased conditions so that chips with defects therein can be accelerated to failure, thereby avoiding their incorporation into a multichip integrated circuit module. Pursuant to the invention, special connection arrays are disposed in spacer blocks in a predetermined configuration on a substrate. The blocks define areas of the substrate which preferably accommodate a plurality of integrated circuit chips such that each chip is surrounded on each side by a spacer block. One or more connection arrays may be provided in each spacer block. The connection arrays have interconnection pads which in the final structure are accessible to an external probing device. Specific methods of fabrication are also disclosed.

34 Claims, 3 Drawing Sheets

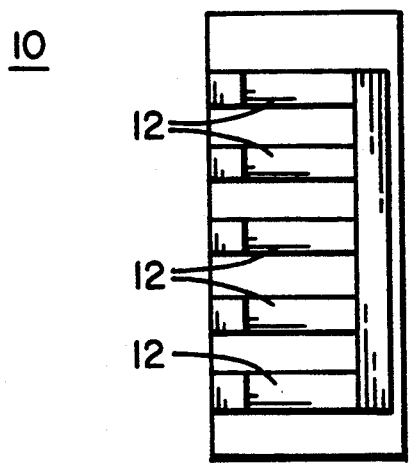
FIG. 1
FIG. 2
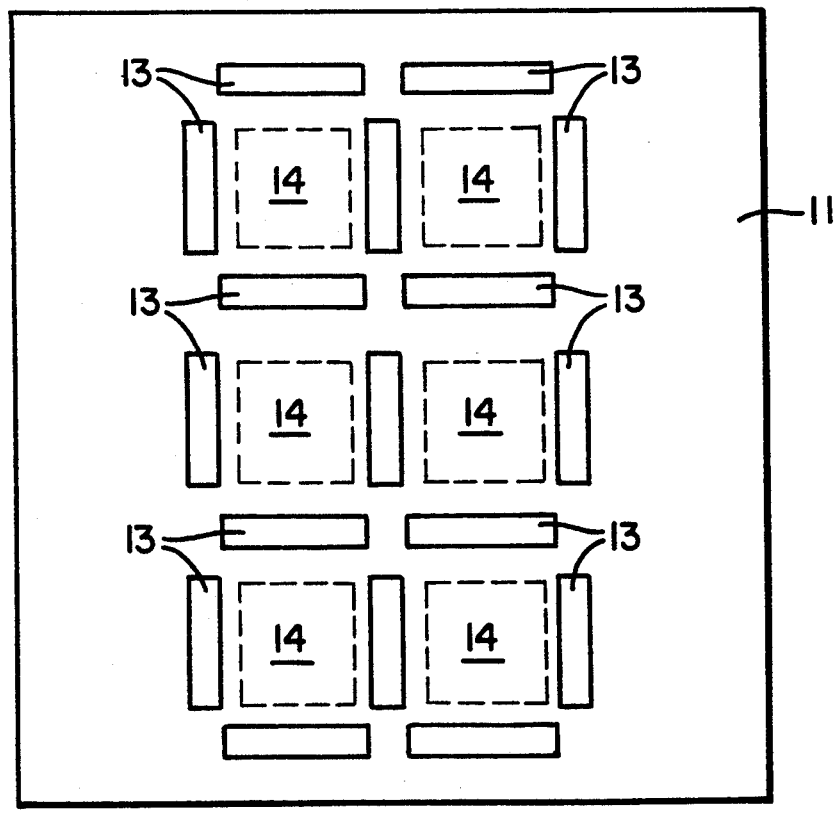

METHODS FOR TESTING AND BURN-IN OF INTEGRATED CIRCUIT CHIPS

This application is a continuation, division of application Ser. No. 07/676,206, filed Mar. 27, 1991, now U.S. Pat. No. 5,091,769.

BACKGROUND OF THE INVENTION

1. Technical Field

The present invention relates to packaging electronic integrated circuit chips into operable chip systems in a manner to facilitate burn-in and testability thereof. In particular, this invention addresses the problem of testing bare integrated circuit chips before they are committed to a multichip module. Further, it addresses the problem of burning in bare chips under bias conditions so that chips with defects which could cause premature failure can be accelerated to failure, thereby avoiding incorporation of bad chips into a module.

2. Description of the Prior Art

One basic problem with existing technology is that chips which are available are not fully tested. This is due to a number of factors. First, the present manufacturing approach is to test chips at the wafer level just to the point that insures that the chip will probably work in the final package. At this point, chips are packaged and then fully tested. This manufacturing approach is economical for two reasons. First, it is necessary to test the packaged circuit in all cases because of the possibility of failure during the packaging operation. Packaging failures can occur as a failed package, a failure in the die to package wire bonding process or damage to the die during operations subsequent to wafer probing including sawing and placement of die into a package. Second, the number of bad die which pass wafer probe but which subsequently do not pass full testing is relatively small. As a result, the cost of packaging die before full test is not significant. Another reason chips are not fully tested at the wafer level is due to limited speed capability in wafer probing systems. Typically, probes are relatively long and are not impedance stabilized. As a result, as frequencies increase, crosstalk and ringing on digital lines exceeds the noise margin of the system and makes testing impossible. Special test fixtures have been built which allow testing of packaged parts at high speed.

A new problem which limits full testing at the wafer level is due to the number of I/O pads on a given chip. As chip complexity increases, the number of pads on the chip increases to a point where probing all the pads on the chip at one time becomes difficult or impossible. A further complicating factor is the trend toward decreasing the size of chip pads. As the pad size decreases, the ability of conventional probes to make contact to the pads is decreased. These two problems again require that some method other than wafer probing be used to completely test the chips.

High performance testing probes are becoming available based on thin film technology. A major problem with the high performance thin film probe, however, is that it is very expensive and requires a custom system for optimum utilization. Finally, thin film bump probes do not make good electrical connection through the oxide on conventional aluminum pads. The problem here then is to provide a method which allows so called bump probes to make good electrical connection in the face of conventional aluminum chip pads and to utilize a single optimized bump probe configuration for probing a variety of integrated circuit chips.

Techniques are available for making temporary interconnection to area arrays of pads which give a high density of interconnect and good electrical performance. These techniques, however, are amenable to probing of printed circuit boards and not to probing of IC chips. This is due primarily to the fact that IC chips are available with pads on their periphery and not with area arrays of pads. In addition, the aluminum pad material on the chip is subject to damage by this probing approach. The problem then is that area array contact means such as pogo sticks and button contacts cannot be used for high performance, high interconnect density probing of IC chips.

Another problem relates to the burn-in of bare chips. Burn-in is required to eliminate the early failure of IC chips in a module such that chips which are prone to fail early in their life cycle are not incorporated into a module. In order to accelerate failures of this variety, it is generally required that the chips be operated at a high temperature and under bias conditions with power applied to the chips. In many situations, it is also desirable to apply a rudimentary level of clocking signal to exercise the chip in some way while the burn-in is occurring. This has been done in conventional systems by first packaging the chip and then placing the package in a socket which is mounted on a printed circuit board. Pins of the socket are connected through resistors to power. Clock points on the chips are connected to a clock and power is applied to the chip. Typically, packaged parts are burned-in for as long as 300 hours where very high reliability levels are required, such as spacecraft applications. Burning-in chips at the wafer level is not feasible because there is no provision for bias connection or connection of power, ground and clock signals to all chips on the wafer. The problem then is to find a method wherein a plurality of bare chips can be burned-in under bias.

Several patents have recently issued relating to strategies for bare chip testing, see, for example, U.S. Pat. Nos. 4,884,122 and 4,866,508. These patents relate to methods and structure for bare chip tests and burn-in and, in particular, to specific structures for obtaining temporary interconnect to chips for the purpose of test and burn-in. The disclosed invention also relates to methods and structure for bare chip test and burn-in. It should be noted that the basic concept of making temporary interconnect to a device for the purpose of testing that device is not new. The methods and structure which are disclosed in this invention distinguish over the methods disclosed in the prior art in an important aspect in that there is no requirement for application and subsequent peeling of any overlay layer. Instead, the disclosed structure of the present invention employs a solvent sensitive encapsulant, which (as described herein) has several practical advantages over the overlay approach.

SUMMARY OF THE INVENTION

In a preferred embodiment the present invention, an integrated circuit chip package comprises a substrate together with a plurality of integrated circuit chips affixed to the substrate. The integrated circuit chips have interconnection pads thereon for connection to other chips or to different parts of the same chip. A plurality of spacer blocks are disposed on the substrate such that each block is located at a side of a chip of the plurality of integrated circuit chips, with at least some of the spacer blocks being disposed between the chips. At least one of the plurality of blocks includes a connection array for applying one of a biasing signal, power signal, ground signal and clock signal to selected chip interconnection pads. Each connection array has a plurality of interconnection pads thereon. An encapsulant surrounds the integrated circuit chips and the spacer blocks such that the encapsulant has an upper surface above the tops of the circuit chips and the tops of the spacer blocks. The encapsulant is provided with via openings therein which are aligned with at least some of the chip interconnection pads and the connection array interconnection pads. Finally, a pattern of interconnection conductors is disposed on the upper surface of the encapsulant so as to extend between at least some of the openings and so as to provide electrical connection between some of the chip interconnection pads and the connection array interconnection pads through the openings.

In an enhanced embodiment, a plurality of the spacer blocks disposed about the chips include a connection array and at least one of the connection arrays comprises a resistive array for applying a biasing signal to selected chip interconnection pads. Further, the encapsulant, together with the pattern of interconnection conductors disposed thereon, is preferably removable. Also, each of the plurality of spacer blocks may include a connection array, with the connection arrays being positioned relative to the substrate in a predetermined footprint pattern.

In accordance with another embodiment of the present invention, a method for producing integrated circuit chip packages for testing begins by disposing in a predetermined pattern a plurality of spacer blocks on a substrate having a substantially flat upper surface. The spacer blocks are patterned to frame a multiplicity of areas on the substrate's upper surface. At least one of the plurality of blocks includes a connection array for applying one of a biasing signal, power signal, ground signal and clock signal to selected chip interconnection pads. The connection array has a plurality of interconnection pads thereon. A plurality of integrated circuit chips are also disposed on the substrate such that each chip resides in one of the areas framed by the spacer blocks. An encapsulant is then employed to surround the chips and the spacer blocks. The encapsulant has an upper surface above the tops of the chips and the spacer blocks. A plurality of via openings are provided in the encapsulant, with the openings being disposed over at least some of the chip interconnection pads and the connection array interconnection pads. As described above, a layer of metallization is provided on the encapsulant extending between the via openings so as to electrically connect selected chip interconnection pads and connection array interconnection pads through the openings. As above, a plurality of connection arrays may be disposed on the spacer blocks and a particular spacer block may have more than one connection array thereon.

In addition to applying burn-in conditions, in certain enhanced embodiments, the method of the present invention includes testing the integrated circuit chips disposed in the package by applying one of a biasing signal, power signal, ground signal and clock signal to selected chip interconnection pads using the at least one connection array disposed in the package. Subsequent testing, the method also includes recovering the integrated circuit chips from the package. In one specific recovery embodiment, the pattern of electrical conductors is first etched from the encapsulant, which preferably comprises a solvent sensitive material, and the encapsulant is then dissolved in a solvent. If desired, the adhesive holding the integrated circuit chips to the substrate may also comprise a solvent sensitive material, which is either sensitive to the same solvent as the encapsulant or a different solvent. Further features of the present invention are also described and claimed herein.

Accordingly, it is an object of the present invention to provide a method for pretesting and burn-in of unpackaged integrated circuit chips before the chips are committed to a multichip module.

Another object of the present invention is to provide a carrier which can handle a multiplicity of integrated circuit chips and which supplies at least one of power signals, ground signals, clock signals and bias signals to selected chip interconnection pads with a minimum number of external connections to the carrier.

Still another object of the present invention is to provide a method for fully testing bare integrated circuit chips at normal operating speed notwithstanding large numbers of chip input output pads.

A further object of the present invention is to provide a method and package for making contact to pads of an integrated circuit which are too small to be probed using conventional chip test apparatus.

A still further object of the present invention is to provide a method for temporary interconnect to a multiplicity of integrated circuits under test which provides little stress on the chips and protects the chips during the test and burn-in handling and which provides an easy and stress free high yield method of chip recovery.

A yet further object of the present invention is to provide a method and structure wherein pads of chips are brought to a common footprint for subsequent probing by a custom probe either of an area array configuration or of a thin film bump configuration.

Yet another object of the present invention is to provide good electrical contact to special purpose probes such as thin film bump probes, notwithstanding the existence of commercial aluminum pads.

Lastly, but not limited hereto, it is an object of the present invention to provide a carrier such that tested die can be recovered in situ and carried to the next processing operation while still being separately maintained from one another.

BRIEF DESCRIPTION OF THE DRAWINGS

The subject matter which is regarded as the present invention is particularly pointed out and distinctly claimed in the concluding portion of the specification. The invention, however, both as to organization and method of practice, together with further objects and advantages thereof, can best be understood by reference of the following detailed description taken in conjunction with the accompanying drawings in which:

FIG. 1 is a plan view of one embodiment of a connection array pursuant to the present invention;

FIG. 2 is a plan view of one embodiment of a pattern of spacer blocks disposed on a substrate pursuant to the present invention;

DETAILED DESCRIPTION OF THE INVENTION

Figure 3A:
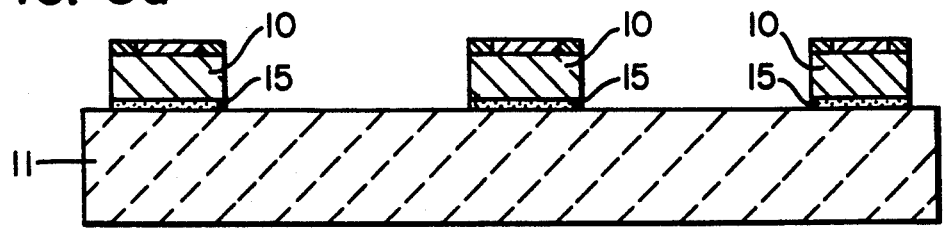
FIGS. 3a-3e are cross-sectional elevational views of an integrated circuit chip package at different stages during the fabrication, testing and recovery processes pursuant to the present invention.

In accordance with the present invention, a bare-chip carrier structure and method of fabrication are disclosed which provide the following attributes: 1) a means to separate the integrated circuit chips from one another; 2) a means to distribute power, ground and clock signals; 3) a means to bias inputs and appropriately load outputs for burn-in under bias conditions; 4) a means of interconnection from the chip to power, ground and clock signals and biasing resistors; and 5) a means of temporary interconnect which connects from pads on the chip to a predetermined common footprint pattern which can be probed by an appropriate probing method.

According to a presently preferred embodiment of the present invention, the attributes of separating chips and of providing bias resistors are combined in a single structure. This is done by fabricating a long, thin chip-like insert, generally denoted 10 in FIG. 1, which contains an array of bias resistors 12. Resistor array 12 is described in greater detail in a co-filed U.S. patent application Ser. No. 07/676,937, entitled "Multichip Integrated Circuit Module and Method of Fabrication," which is assigned to the same assignee as the present invention and which is fully incorporated herein by reference. In addition, insert 10 could be configured as a power or ground distribution chip, in which case a conductive material would be substituted for resistors 12.

FIG. 2 depicts the placement of inserts 10 on a carrier 11, i.e., in blocks 13, such that they provide the function of separating individual chips 14 from one another and also of providing bias resistors for input and output devices (not shown) on the chips 14. Each block 13 in FIG. 2 may comprise one or more than one chip-like insert 10. In addition, one or more (but preferably not all) of the blocks 13 about each IC chip 14 may simply comprise a spacer chip, i.e., a chip lacking a resistive array or other distributive array which would facilitate connection to multiple pads on the chip. Such a configuration would be acceptable, for example, if a minimum number of devices on the chip are to be biased during the burn-in process.

According to the resistor array fabrication method of the cross-referenced application, resistor material is deposited and patterned on a large substrate. Subsequently, end terminations are deposited and patterned and the large substrate is then sawed into the individual arrays of resistors. A die attach material 15 (FIG. 3a) such as DIEL3B available from Zeon Technology of Nashua, New Hampshire can be used to attach the resistor arrays. When this material is cured by baking at a temperature of 220° C. for twenty minutes it is insoluble in normal solvents. This creates an essentially permanent structure consisting of a flat substrate (i.e., carrier 11) with resistor array spacers 10 in blocks 13 permanently bonded to the substrate.

Figure 3B:
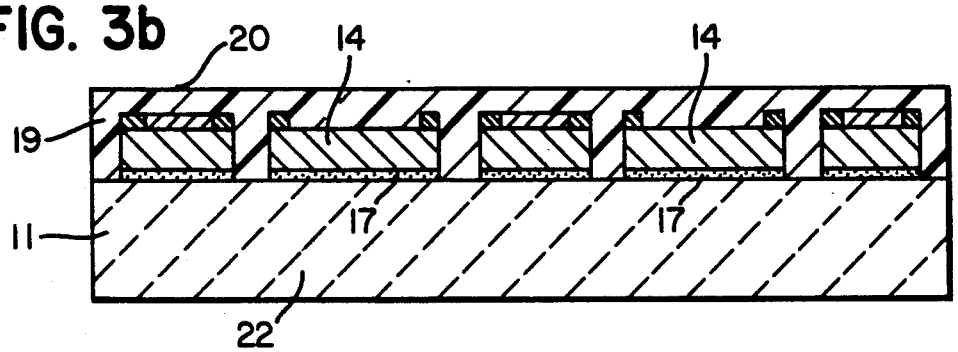

At this point, a solvent-sensitive die attach material 17 consisting of 50% cellosolveacetate and 50% high molecular weight epoxy can be used. This material is spin coated, and dried five minutes at 100° C. and five minutes at 150° C. Die attach proceeds by heating the substrate to a temperature of 100° C. and appropriately positioning the chips 14 on the substrate 11 within the spaces defined by blocks 13. At this point, the die attach material is soft and sticky. The die readily hold their position so that accurate placement can be achieved. Encapsulation of the structure (FIG. 3b) is achieved by encapsulating the chips using the apply, cure and lap method disclosed in the cross-referenced application.

According to this method, an encapsulant material 19 is poured on the substrate and spun for a short period of time at a low spin speed. This results in a very thick coating of encapsulant material on top of and between the chips. After proper drying of the encapsulant, a lapping process is used to lap the encapsulant material 19 to within 1 or 2 mils of the top of the chips and to create a flat encapsulant surface 20 which is parallel with the lower surface 22 of the substrate 11. The particular encapsulant material used is preferably a material which is specifically designed to be solvent sensitive. As an example, a high molecular weight epoxy 75% by weight and 25% cellosolveacetate can be used. Drying proceeds for fifteen minutes at 100° C. and twenty minutes at 150° C. Spin conditions of ten seconds at a spin of 400 rpm are sufficient to spread the material relatively evenly over the substrate.

Figure 3C:
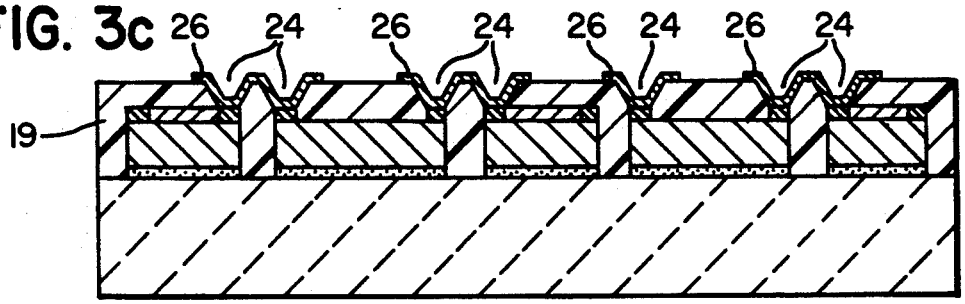

The next step in the process involves using an Excimer laser to form via holes 24 in the polymer material 19. One hundred pulses at a wave length of 248 nanometers is sufficient with an energy at the surface of 1 to 2 joules per centimeter square. After drilling the via holes, the substrate is placed in a sputtering chamber and titanium followed by copper is sputtered on the surface of the substrate and in the via holes. The actual sputtering operation for a Balzer 450 consists of two minute back sputtering at 1,000 watts using a pressure of 1 micron of argon followed by eight minutes of titanium with a magnitron sputtering unit at 2,200 watts followed by twenty minutes of copper at 2,200 watts. The metallization 26 is then patterned to create the desired footprint pattern and to make connection to the bias resistors and to make connection to bus circuitry which distributes power (FIG. 3c).

Figure 4:
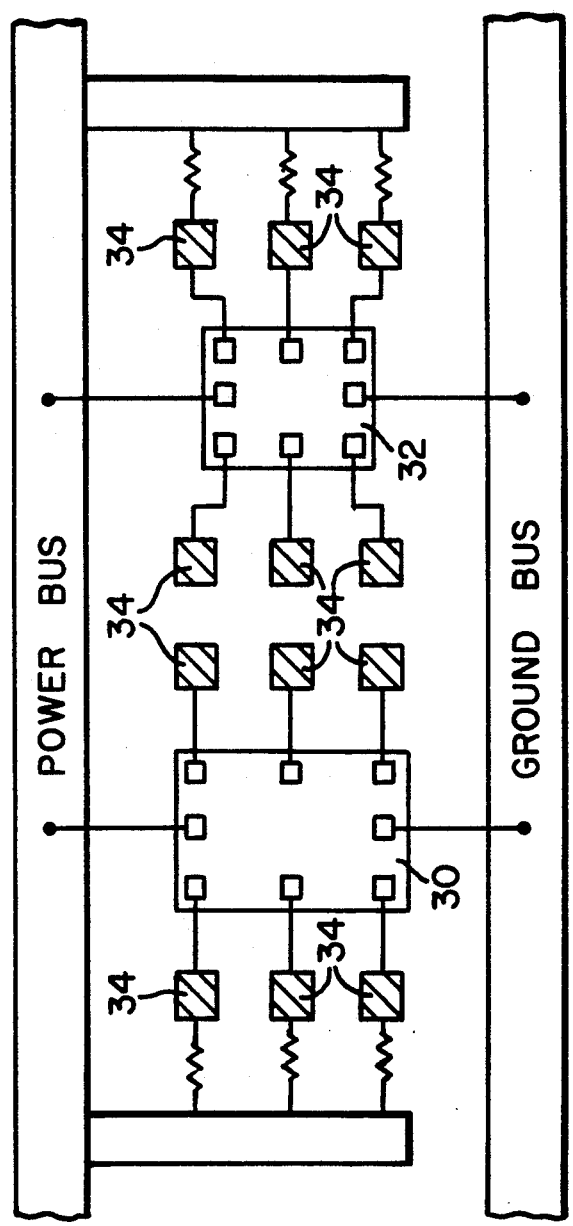
FIG. 4 is a schematic view of one circuit embodiment of an external connect pattern of conductors for testing of two integrated circuit chips pursuant to the present invention.

FIG. 4 shows a schematic representation of a typical footprint concept. It can be seen that although chips 30 and 32 of different sizes are connected, the external connect pattern of conductors 34 can be contacted by the same probing device. This basic concept can be extended to include pad array configurations which would match to a pogo probe or button contacts or alternatively the configuration can be matched to a thin film bump probe such as available from TekTronics of Beaverton, Oreg.

At the point where copper is patterned, it may be desirable to protect the copper from oxidation by a flash of electroless gold. The gold plating improves the contact by eliminating oxide on the metallization. An electroless gold plating system which will work is EL221 from Shippley Co., Newton, MA. First, parts are dipped in a solution of 10% citric acid for three minutes followed by rinsing and dipping directly in the electroless gold bath operated at 50° C. for a period of fifteen minutes. This puts down a coating of approximately eight micro inches of gold.

Figure 3D:
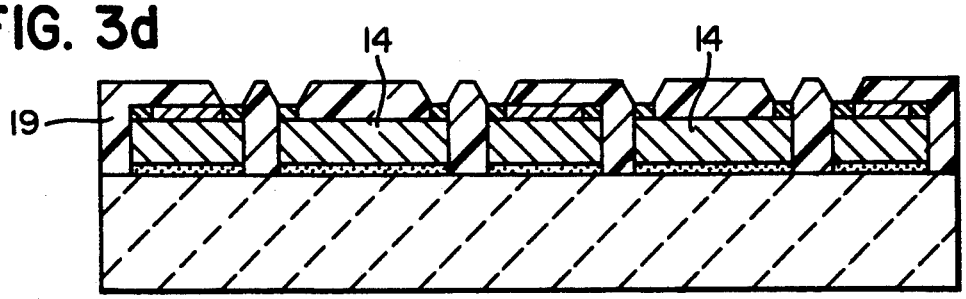
Figure 3E:
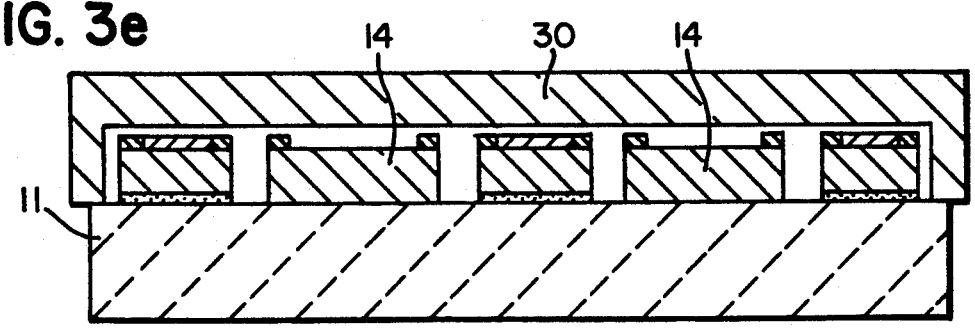

Chips can be recovered by the following procedure. The copper is etched in concentrated nitric acid for a period of one minute. The titanium is then etched using PAD etch available from Transene Corporation. This etches the titanium but does not attack the aluminum or gold pads of the chip and the resistor arrays. At this point, no metallization remains on the surface of the encapsulant 19 for making connection to the chips 14 (FIG. 3d). After the metallization has been removed the substrate is placed in a solvent which dissolves the encapsulant material 19 and which also dissolves the die attach material 17. This process of dissolving can be assisted by ultrasonic agitation. In the preferred embodiment, for the encapsulant and die attach material disclosed, acetone can be used as the solvent. Once the die attach material is dissolved the chips are free to be removed from the substrate. However, it is desirable to keep the chips on the substrate until they are ready to be placed in the final module. This can be done conveniently by placing a top 30 over the substrate 11 which is fitted to be a few mils above the height of the combination resistor—spacer elements. In this way, the chips can be conveniently held in place and carried on the substrate without danger of losing chips.

Two variations in the process can be used to enhance its value. First, a die attach material may be used which is not solventable in the same solvent that dissolves the encapsulant. Such a die attach material for example is RELY IMIDE available from M & T Chemicals of Rahway, N.J. This material can be spin coated, with die placed in the material while it is still wet. Subsequently, drying of fifteen minutes at 100° C. followed by thirty minutes at 150° C. is carried out. This material is not sensitive to acetone but is sensitive to cellosolveacetate and to methylene chloride. As such the encapsulant can be dissolved and the chips will stay in place. At this point, the top surface of the chips can be scrubbed using high pressure water scrubbing techniques in order to clean that surface of any debris which was previously on the chip or which was subsequently deposited on chips during encapsulant application and/or subsequent removal. Thereafter, a very clean source of solvent for the die attach can be used with little potential of recontaminating the chips.

A second modification in the process involves providing small holes in the substrate (11) which can assist in the operation of separating the chip from the bottom of the substrate. The holes provide three functions. They allow the solvent for the die attach to attack the die attach from a position other than the edge of the chips. Second, they provide an entry point for a small rod to actually push on the chip (14) to separate it from the substrate (11). Third, they provide an entry and distribution point for compressed air to be used to lift a chip from the substrate. Before compressed air is used, however, a cover (30) should be placed on the substrate so that chips are not literally blown away from the substrate.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method for packing integrated circuit chips for testing, each of said integrated circuit chips to be packaged including at least one interconnection pad, said method comprising the steps of:
    (a) disposing in predetermined pattern a plurality of spacer blocks on a substrate having a substantially flat upper surface, said spacer blocks being patterned to frame a multiplicity of distinct areas on said substrate's upper surface, at least one of said plurality of spacer blocks including a connection array for applying one of a biasing signal, power signal, ground signal and clock signal to selected chip interconnection pads, said at least one connection array having at least one interconnection pad;
    (b) disposing a plurality of integrated circuit chips on said substrate, each of said chips being disposed in one of said areas framed by said spacer blocks such that each chip is bounded on at least one side by a spacer block;
    (c) employing an encapsulant to completely surround said chips and said spacer blocks and said upper surface of said substrate so that any space between said chips and said spacer blocks is filled by said encapsulant material;
    (d) providing a plurality of via openings in said encapsulant, said openings being disposed over at least some of said chip interconnection pads and said connection array interconnection pads; and
    (e) providing a pattern of electrical conductors above said encapsulant such that said conductors extend to said via openings so as to electrically connect selected chip interconnection pads and connection array interconnection pads through said openings.

2. The packaging method of claim 1, wherein said encapsulant employed in step (c) comprises low viscosity material and said method further includes curing said low viscosity material to a hardened, high viscosity encapsulant.

3. The packaging method of claim 2, wherein said curing step includes drying said employed encapsulant material.

4. The packaging method of claim 1, further comprising the step of lapping the top surface of said encapsulant to within two mils of the top surface of the chips, said lapped top surface of encapsulant being substantially parallel to the upper surface of said substrate.

5. The packaging method of claim 1, wherein said employed encapsulant comprises a solvent-sensitive material.

6. The packaging method of claim 5, further in combination with the step of burning-in said integrated circuit chips.

7. The combination method of claim 6, wherein said burning-in step includes applying one of a biasing signal, power signal, ground signal and clock signal to selected chip interconnection pads via said at least one connection array having a plurality of connection pads thereon.

8. The combination method of claim 7, further comprising the step of applying a high ambient temperature to said integrated circuit chip package for a predetermined length of time, said ambient temperature and said period of time being selected to sufficiently burn-in said plurality of integrated circuit chips.

9. The combination method of claim 8, further comprising the steps of testing said integrated circuit chips and recovering said integrated circuit chips from said package.

10. The combination method of claim 9, wherein said encapsulant is solvent-sensitive and said chip recovering step includes the steps of:
    etching said pattern of electrical conductors provided above said encapsulant without damaging said integrated circuit chip interconnection pads; and placing the package in a solvent to dissolve said solvent-sensitive encapsulant.

11. The combination method of claim 10, wherein said chip disposing step (b) includes affixing said plurality of integrated circuit chips to said substrate using a solvent-sensitive adhesive, and wherein said recovery step includes removing said solvent-sensitive adhesive from between said chips and said substrate, said chips being positionally maintained on said substrate by said plurality of spacer blocks.

12. The combination method of claim 11, further comprising the step of securing a cover over the top of said substrate with said integrated circuit chips positionally maintained thereon in said framed areas defined by said spacer blocks.

13. The combination method of claim 9, wherein said substrate includes a plurality of small holes disposed therein extending from the upper surface thereof to a lower surface of the substrate, said substrate holes being aligned substantially under said plurality of integrated circuit chips.

14. A method for packaging integrated circuit chips for burn-in, said method comprising the steps of:
(a) disposing a plurality of integrated circuit chips on a substantially flat upper surface of a substrate, each of said integrated circuit chips disposed on said substrate having at least one interconnection pad and each having multiple exposed surfaces when disposed on said substrate;
(b) disposing in a predetermined pattern a plurality of spacer blocks on said substrate such that each block is located at a side of at least one of said plurality of integrated circuit chips, at least one of said plurality of spacer blocks including a connection array for applying one of a biasing signal, power signal, ground signal and clock signal to at least one selected chip interconnection pad, each of said spacer blocks disposed on said substrate having multiple exposed surfaces and said at least one connection array having at least one interconnection pad;
(c) surrounding all exposed surfaces of said chips and said spacer blocks disposed on said upper surface of said substrate with an encapsulant such that space between said chips and said spacer blocks is filled by said encapsulant;
(d) providing a plurality of via openings in said encapsulant, said openings being disposed over at least some of said chip interconnection pads and said connection array interconnection pads; and
(e) providing a pattern of electrical conductors above said encapsulant such that said conductors extend to via openings so as to electrically connect selected chip interconnection pads and connection array interconnection pads through said openings.

15. The packaging method of claim 14, wherein said encapsulant employed in said step (c) comprises a low viscosity material and said method further includes curing said low viscosity material to a hardened, high viscosity encapsulant.

16. The packaging method of claim 15, wherein said curing step includes drying said employed encapsulant material.

17. The packaging method of claim 14, further comprising the step of lapping the top surface of said encapsulant to within 2 mils of the top surface of the chips, said lapped top surface of encapsulant being substantially parallel to the upper surface of said substrate.

18. The packaging method of claim 14, further in combination with the step of burning-in said integrated circuit chips.

19. The combination method of claim 18, wherein said burning-in step includes applying one of a biasing signal, power signal, ground signal and clock signal to selected chip interconnection pads via said at least one interconnection array having a plurality of interconnection pads thereon.

20. The combination method of claim 19, further comprising the step of increasing the ambient temperature surrounding said integrated circuit chip package for predetermined length of time, said ambient temperature and said period of time being selected to sufficiently burn-in said plurality of integrated circuit chips.

21. The combination method of claim 20, further comprising the steps of testing said integrated circuit chips and subsequently recovering said integrated circuit chips from said package.

22. The combination method of claim 21, wherein said encapsulant is solvent-sensitive and said chip removing step includes the steps of:
etching said pattern of electrical conductors provided above said encapsulant without damaging said integrated circuit chip interconnection pads; and
placing the package in a solvent to dissolve said solvent-sensitive encapsulant.

23. The combination method of claim 22, wherein said chip disposing step (a) includes affixing said plurality of integrated circuit chips to said substrate using a solvent-sensitive adhesive, and wherein said recovery step includes removing said solvent-sensitive adhesive from between said chips and said substrate, said chips being at least partially positionally maintained on said substrate by said plurality of spacer blocks.

24. A method for packaging, burning-in and retrieving integrated circuit chips, said method comprising the steps of:
(a) disposing a plurality of integrated circuit chips on a substrate having a flat upper surface, each of said integrated circuit chips disposed on said substrate having multiple exposed surfaces, one of said exposed surface having at least one interconnection pad;
(b) employing an encapsulant to surround all of said exposed chip surfaces such that space between said chips is completely filled by said encapsulant material and said encapsulant material covers said chips;
(c) providing a plurality of via openings in said encapsulant, said openings being disposed over at least some of said chip interconnection pads;
(d) providing a pattern of electrical conductors above said encapsulant such that said conductors extend to said via openings so as to electrically connect selected interconnection pads;
(e) applying at least one of a biasing signal, power signal, ground signal and clock signal to selected ones of said chip interconnection pads using said pattern of electrical conductors;
(f) burning-in said plurality of packaged integrated circuit chips; and
(g) exposing said burned-in integrated circuit chips by removing said pattern of electrical conductors on said encapsulant and dissolving said encapsulant.

25. The method of claim 24, wherein said encapsulant employed in said step (b) comprises a low viscosity material and said method further includes curing said low viscosity material to a hardened, high viscosity encapsulant.

26. The method of claim 25, wherein said employed encapsulant comprises a solvent-sensitive material.

27. The method of claim 24, wherein said burning-in step (f) includes applying a high ambient temperature to said integrated circuit chip package for a predetermined length of time, said ambient temperature and said period of time being selected to sufficiently burn-in said plurality of integrated circuit chips.

28. The method of claim 24, further comprising the step of recovering said burned-in integrated circuit chips exposed in said step (g).

29. The method of claim 28, wherein said chip disposing step (a) includes affixing said plurality of integrated circuit chips to said substrate using a solvent-sensitive adhesive, and wherein said chip recovering step includes removing said solvent-sensitive adhesive from between said chips and said substrate.

30. The method of claim 24, wherein said pattern of electrical conductors provided in said step (d) includes a predetermined footprint-type pattern on an upper surface of said encapsulant.

31. A method for retrieving package integrated circuit chips subsequent burn-in thereof, said packaged integrated circuit chips each have at least one interconnection pad and are disposed on a substantially flat upper surface of a substrate such that one surface of each chip is in opposing relation to said substrate upper surface, the remaining surfaces of said chips being covered with a solvent-sensitive encapsulant material such that said encapsulant covers all surfaces of each chip other than the chip surface in opposing relation to said substantially flat upper substrate surface and fills the space between said integrated circuit chips disposed on said substrate, a plurality of electrical conductors are further disposed so as to extend within said encapsulant and electrically connected selected chip interconnection pads, said retrieval method comprising the steps of:

(a) removing said pattern of electrical conductors from said encapsulant material;

(b) dissolving said solvent-sensitive encapsulant material so as to expose said plurality of integrated circuit chips disposed on the upper surface of said substrate; and (c) removing said exposed integrated circuit chips from the upper surface of said substrate.

32. The chip retrieval method of claim 31, wherein said electrical conductor removing step (a) includes etching said pattern of electrical conductors from said encapsulant material without damaging said integrated circuit chip interconnection pads.

33. The chip retrieval method of claim 31, wherein said encapsulant material dissolving step (b) includes applying a solvent to said solventsensitive encapsulant material so as to dissolve said material surrounding said integrated circuit chips.

34. The chip retrieval method of claim 31, wherein said plurality of integrated circuit chips are fixed to said substantially flat upper surface of said substrate with a solvent-sensitive adhesive and wherein said exposed integrated circuit chip removing step (c) includes dissolving said solvent-sensitive adhesive affixing said integrated circuit chips to said substrate.

* * * * *

UNITED STATES PATENT AND TRADEMARK OFFICE
CERTIFICATE OF CORRECTION

PATENT NO. : 5,149,662
DATED : Sep. 22, 1992
INVENTOR(S) : Eichelberger It is certified that error appears in the above-identified patent and that said Letters Patent is hereby corrected as shown below:

```
Column 7,  line 66, insert --a-- between "in predetermined"
Column 8,  line 29, insert --a-- between "comprises low"
Column 10, line 13, insert --a-- between "for predetermined"
Column 10, line 44, substitute --surfaces-- for "surface"
Column 11, line 22, substitute --predefined-- for "predetermined"
Column 11, line 24, substitute --packaged-- for "package"
Column 12, line 23, insert --(-)-- between "solventsensitive"
Column 12, line 27, substitute --affixed-- for "are fixed"
```

Signed and Sealed this

Fifth Day of October, 1993

Attest:

BRUCE LEHMAN

Attesting Officer

Commissioner of Patents and Trademarks